United States Patent [19]

Harwood et al.

[11] 4,277,710

[45] Jul. 7, 1981

[54] CONTROL CIRCUIT FOR PIEZOELECTRIC ULTRASONIC GENERATORS

[75] Inventors: Philip C. Harwood, Elgin; George H. Johnson, Dundee, both of Ill.

[73] Assignee: Dukane Corporation, St. Charles, Ill.

[21] Appl. No.: 34,294

[22] Filed: Apr. 30, 1979

[51] Int. Cl.[3] .......... H01L 41/08

[52] U.S. Cl. .......... 310/316; 318/118

[58] Field of Search .......... 310/316, 317, 26; 318/116, 118; 156/380, 580.1

[56] References Cited

U.S. PATENT DOCUMENTS

| | | | |
|---|---|---|---|
| 3,432,691 | 3/1969 | Shoh | 310/316 |
| 3,434,074 | 3/1969 | Libby | 310/316 X |
| 3,487,237 | 12/1969 | Krenke | 310/316 |
| 3,524,082 | 8/1970 | Mettler | 310/316 |
| 3,539,888 | 11/1970 | De Prisco et al. | 310/316 X |
| 3,819,961 | 6/1974 | Bourgeois et al. | 310/316 |
| 3,842,340 | 10/1974 | Brandquist | 310/316 X |
| 3,967,143 | 6/1976 | Watanabe et al. | 310/316 |
| 4,056,761 | 11/1977 | Jacoby et al. | 310/316 |
| 4,175,242 | 11/1979 | Kleinschmidt | 310/316 |

*Primary Examiner*—Mark O. Budd
*Attorney, Agent, or Firm*—Vogel, Dithmar, Stotland, Stratman & Levy

[57] ABSTRACT

A high power ultrasonic generator for driving a transducer/horn assembly includes a transistor bridge inverter power output circuit connected to a DC source for producing an alternating output current. A pulse generating circuit produces a bipolar train of pulses for controlling the switching of the transistors in the bridge inverter circuit. The pulse widths are adjusted to provide a dead time therebetween at least equal to the storage time of the inverter transistors to prevent any overlap in the conduction of the opposite legs thereof. Overload control means reduces the widths of the pulses when the output current exceeds predetermined levels, thereby to reduce the output current. A starting circuit in the pulse generator gradually increases the pulse widths during start-up of the generator, and other circuitry protects against unduly high current loads in the power supply during AC turn-on of the system. The pulse generating circuit also includes a phase locked loop oscillatory circuit having an input connected through a bandpass feedback amplifier to the power output circuit for synchronizing the pulse generating circuit to the frequency of operation of the transducer/horn assembly, the bandpass amplifier being selectively tunable for use with different horns.

25 Claims, 13 Drawing Figures

FIG. 5A VOLTS

FIG. 5B VOLTS

FIG. 5C VOLTS

FIG. 5D VOLTS

FIG. 5E VOLTS

FIG. 6A VOLTS

FIG. 6B VOLTS

FIG. 6C VOLTS

CONTROL CIRCUIT FOR PIEZOELECTRIC ULTRASONIC GENERATORS

BACKGROUND OF THE INVENTION

The present invention relates to a generator for producing an alternating current at an ultrasonic frequency for driving an ultrasonic transducer. In particular, the present invention relates to high power ultrasonic generators.

Ultrasonic generators for operating transducer/horn assemblies for various ultrasonic applications such as the welding of plastic parts or the like are well known. Such generators have performed relatively well in low power applications, i.e., when the generator is operating at 800 watts or less of output power and/or uses a power supply voltage of less than 200 VDC. At these lower power levels the currents and voltages utilized within the system are generally well within the limits of available power transistors.

But with the development of ultrasonic applications requiring higher power ultrasonic generators, it has been necessary to utilize higher power supply voltages in the range of 300–400 VDC, derived from a 240 VAC line source. These higher voltages and the resulting higher currents create serious problems when the operation of the system deviates from optimum conditions. Thus, current overloads which result from overloading of the transducer/horn assembly or deviation of the operating frequency or phase thereof from the nominal operating frequency tend readily to burn out the power transistors and other components in the generator. This necessitates either overdesign of the system so as to tolerate the worst-case current loads, or frequent replacement of power transistors, both very expensive solutions. While the prior art systems typically utilize fuses or circuit breakers to de-energize the system in the event of a current overload, these measures are effective only in protecting the user's power lines, and do not operate fast enough to protect circuit components such as power transistors which can burn out in a matter of microseconds. Furthermore, such protective devices have to be reset each time they are tripped.

Another difficulty with the prior art ultrasonic generators is that during start-up heavily loaded massive transducer/horn assemblies tend to draw extremely large currents. Various types of current-limiting arrangements have been utilized in the prior art but have presented significant disadvantages. For example, it is known to limit the direct current flow to the power transistors during start-up of the device, but only partially effective means have been used. Furthermore, while these arrangements tend to protect the power output transistors, they do not protect other parts of the generator, such as the oscillatory components, which also tend to undergo high demand at start-up.

Another transient overload phenomenon which can occur in ultrasonic generators, particularly those using a transistor bridge in the power output circuit, stems from the fact that a transistor has a certain storage time such that the collector-emitter junction will continue to be conductive for a predetermined short time after control voltage has been removed from the base. Thus, it is possible that the conducting conditions of the opposite halves of the bridge may momentarily overlap, thereby creating a short-circuit, and a momentary surge of current through this low impedance path can easily burn out the power transistors. U.S. Pat. No. 3,487,237, issued to V. G. Krenke, discloses the technique of utilizing a saturable reactor in series with a power transistor for introducing a slight delay in current conduction through the transistor, but the saturable reactor is bulky and expensive and is inefficient because it consumes a considerable amount of power which is dissipated by heating of the saturable reactor.

Finally, prior art ultrasonic generators typically utilize a motional feedback signal representative of the frequency and amplitude of transducer vibration for synchronizing the oscillatory circuitry, thereby to maintain the transducer/horn assembly at mechanical resonance for various loading conditions. Since the system, including the transducer/horn assembly, introduces a certain phase shift at no-load conditions, systems such as that disclosed in U.S. Pat. No. 3,432,691 utilize a series resonant circuit in the feedback loop to introduce a counterbalancing phase shift, but such circuitry dissipates considerable energy in the form of heat, which is essentially wasted. It is also known to use bandpass filters in the feedback loop to eliminate unwanted resonances of the transducer/horn assembly but such filters exhibit undesirable frequency-dependent phase shift characteristics. U.S. Pat. No. 4,056,761 discloses a system for achieving the effect of bandpass filtering without the detrimental phase shift. But that system requires the use of a pickup detector on the sonic transducer or horn, necessitating inconvenient mechanical mounting arrangements.

SUMMARY OF THE INVENTION

The present invention relates to a high power ultrasonic generator which is of compact, economical construction and which overcomes the disadvantages of prior art generators while affording other important operating and structural advantages.

It is a general object of this invention to provide an ultrasonic generator which can be operated efficiently at high power levels while effectively protecting the generator components from current and voltage overloads.

An important object of this invention is to provide an ultrasonic generator which can operate at high power levels while effectively preventing overload of the system components during start-up of the generator.

It is another object of the invention to provide a high power ultrasonic generator which monitors the output current of power transistors in the power output circuit and is responsive to energy levels exceeding a predetermined level for reducing the output current before generator components can be damaged.

It is another object of this invention to provide a high power ultrasonic generator which includes an inverting transistor bridge in the power output circuit, and which effectively prevents short-circuiting of the power supply through the bridge transistors and resultant damage to or destruction of these power transistors.

Still another object of this invention is the provision of an ultrasonic generator which includes a feedback loop for synchronizing the output frequency to the motional resonant frequency of operation of the transducer, and for eliminating spurious resonances while preventing frequency-dependent phase shifts and wasteful dissipation of energy in the feedback loop.

It is another important object of this invention to provide an ultrasonic generator which utilizes phase locked loop and pulse width modulation techniques to control the ultrasonic frequency of operation of the generator and to limit the current dissipation to safe levels.

In connection with the foregoing object, it is another object of this invention to provide an ultrasonic generator which has a power output circuit including a transistor bridge, the frequency of operation of which is controlled by a series of pulses, the widths of the pulses being varied to vary the energy level of the output current.

These and other objects are attained by providing a generator for energizing an electro-acoustic transducer adapted to be coupled to light or heavy loads for transferring acoustic energy thereto, the generator comprising a power output circuit coupled to the transducer and including switching means adapted to be connected to an associated source of direct current for producing an alternating current output, pulse generating means coupled to the switching means and providing thereto a series of pulses at an ultrasonic frequency, the switching means being responsive to each of the pulses for establishing a current flow to the transducer for a time period proportional to the duration of the pulse, and control means coupled to the pulse generating means for varying the widths of the pulses thereby to vary the current flow to the transducer.

Further features of the invention pertain to the particular arrangement of the parts of the ultrasonic generator whereby the above-outlined and additional operating features thereof are attained.

The invention, both as to its organization and method of operation, together with further objects and advantages thereof, will best be understood by reference to the following specification taken in connection with the accompanying drawings.

BRIEF DESCRIPTION OF THE DRAWINGS

FIGS. 5A–5E are wave form diagrams illustrating current and voltage wave forms at various points in the circuitry during the start-up period; and FIGS. 6A–6C are wave form diagrams illustrating current and voltage wave forms at points in the generator circuitry during operation thereof after start-up.

DESCRIPTION OF THE PREFERRED EMBODIMENT

Figure 1:
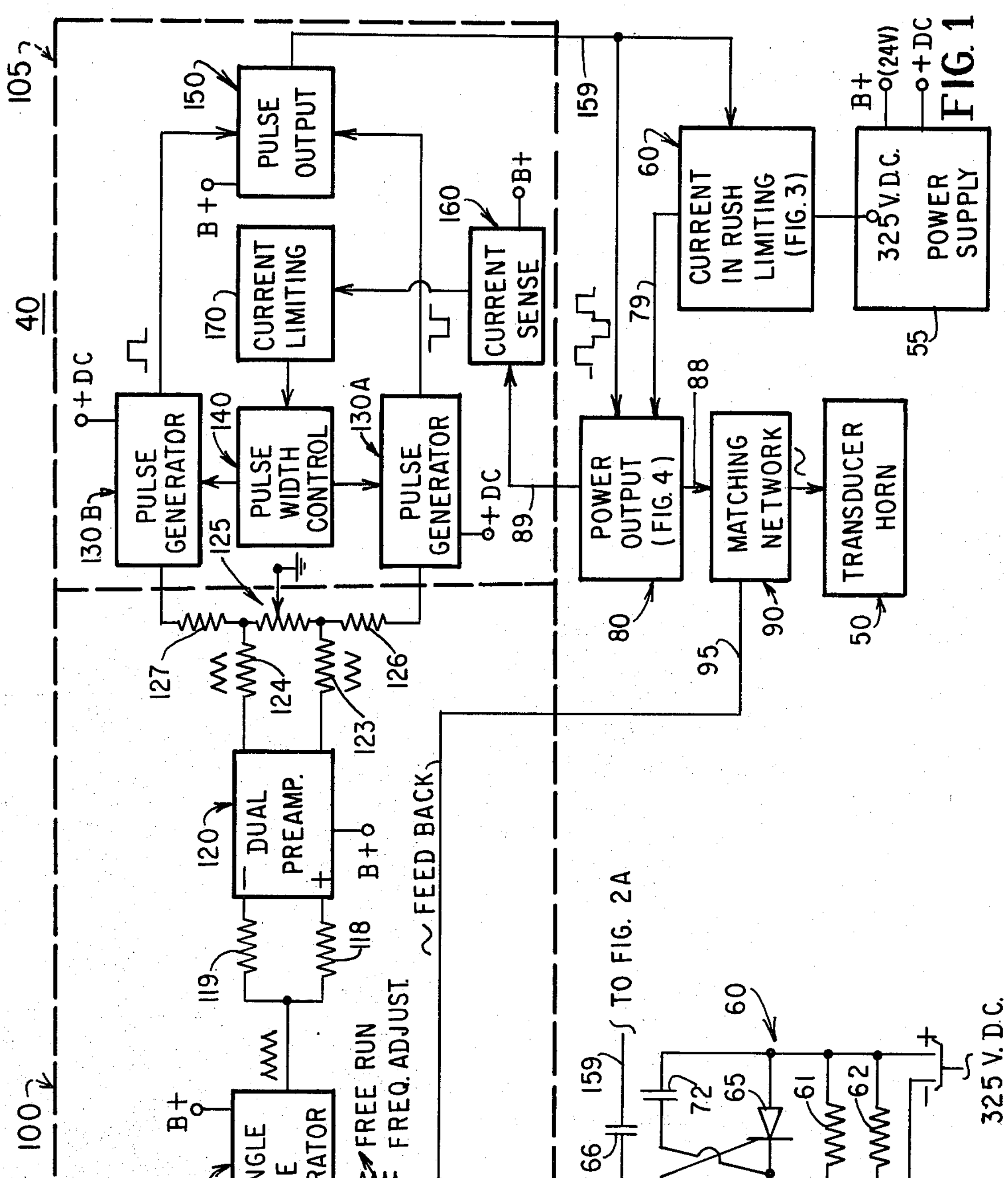
FIG. 1 is a partially schematic and partially block diagrammatic representation of the ultrasonic generator constructed in accordance with and embodying the features of the present invention.

Referring now to FIG. 1 of the drawings, there is illustrated an ultrasonic generator, generally designated by the numeral 40, for providing an alternating current at an ultrasonic frequency to a transducer/horn assembly, generally designated by the numeral 50. The ultrasonic generator 40 is specifically designed for driving a transducer/horn assembly used in ultrasonic welding, but it will be appreciated that the principles of the present invention could be used for other ultrasonic applications.

A power supply 55 provides a +24 VDC supply voltage at a terminal "B+" (negative terminal tied to chassis), a switched +24 VDC voltage at a terminal "+DC" and a +325 VDC supply voltage (negative terminal isolated from chassis) which is applied through a current inrush limiting circuit 60 and a conductor 79 to a power output circuit 80. The power output circuit 80 includes a transistor bridge inverter circuit which switches the DC supply voltage to provide an alternating output voltage at an ultrasonic frequency, this output voltage being fed via the conductor 88 to a matching network 90 and thence to the transducer/horn assembly 50. The matching network 90 is of a type well known in the art and generally illustrated, for example, in FIGS. 10 and 12 of U.S. Pat. No. 3,432,691, in which the alternating voltage is fed through a transformer having a tapped secondary winding, the two portions of which form two arms of a comparator, the other arms of which are formed by two capacitors. The transducer is connected across one of the capacitor arms of the comparator and a feedback signal is derived from the tap of the transformer secondary winding on the conductor 95. The matching network 90 is adjusted to balance out all of the electrical variables in the transducer so that the feedback signal on the conductor 95 is representative only of the motional characteristics of the transducer.

The current inrush limiting circuit 60 is for the purpose of limiting the charging current supplied to the power supply filter capacitors at AC turn-on of the ultrasonic generator 40, and is designed to deactivate the current-limiting function when ultrasonic oscillations are obtained from the ultrasonic generator 40.

The frequency of switching of the transistor bridge in the power output circuit 80 and, thereby, the frequency of the alternating current output on the conductor 88 is controlled by a frequency control circuit, generally designated by the numeral 100. The frequency control circuit 100 and the current control circuit 105 cooperate to generate a free-running frequency, condition it and synchronize it as a function of the output load conditions of the transducer/horn assembly 50. The conditioning constitutes utilizing the free-running frequency to generate a train of pulses, and modulating the width of the pulses to vary the output voltage and current.

Thus, the frequency control circuit 100 includes a triangle wave generator, generally designated by the numeral 110, which operates at a free-running frequency adjustable by means of a variable resistor 111. The triangle waveform at the output of the triangle wave generator 110 is fed to a dual preamplifier 120. More specifically, the triangle waveform is fed through resistors 118 and 119, respectively, to the non-inverting input of one of the preamplifier channels and the inverting input of the other preamplifier channel. Thus, there is produced at the output of the dual preamplifier 120 two triangular waveforms 180 degrees out of phase. These waveforms are fed respectively through resistors 123 and 124 to a symmetry adjustment network 125 for allowing the two output waveforms to be set at equal amplitudes, these two waveforms then being respectively fed through resistors 126 and 127 to two pulse generators 130A and 130B.

Each of the pulse generators 130A and 130B operates as a comparator for comparing the amplitude of the input triangular waveform with an adjustable threshhold level determined by a pulse width control network 140. Thus, as the rising edge of the triangular waveform crosses the threshhold level, an output pulse is initiated and as the trailing edge of the triangular waveform crosses the threshhold level, the pulse is terminated. Because of the phase relationship of the input triangular waveforms thereto, the output pulses from the pulse generator 130B will be 180 degrees out of phase with those at the output of the pulse generator 130A, the pulse generator 130B also being connected so that the output pulses therefrom will be of opposite polarity to those at the output of the pulse generator 130A. The pulse signals at the outputs of the pulse generators 130A and 130B are combined in a pulse output network 150 for interleaving the non-inverted and inverted pulses into a single bipolar pulse train.

This bipolar waveform is fed to the power output circuit 80, wherein the opposite polarity pulses respectively switch the power output transistor bridge for passing the supply voltage to the transducer/horn assembly in opposite directions. Since the pulse repetition rate of the pulse waveform is at an ultrasonic frequency, the result is an ultrasonic alternating voltage at the output of the power output circuit 80 on the conductor 88 for driving the transducer/horn assembly 50.

The pulse width control network 140 contains a manually adjustable control for determining a maximum pulse width. This maximum pulse width is set at less than 180 degrees of the waveform cycle to provide a predetermined "dead time" between the opposite polarity pulses in the bipolar pulse waveform which appears at the output of the pulse output network 150. This "dead time" insures that each inverted pulse cannot start until a predetermined time period after the termination of the preceding non-inverted pulse, and vice versa, for a purpose which will be explained more fully below.

It will be appreciated that the total energy content of the output waveform from the power output circuit 80 will be a function of the width of the pulses supplied thereto from the current control circuit 105. Thus, the wider each pulse, the longer the transistor bridge will remain conductive and the greater will be the average voltage and current on the conductor 88. This permits an effective means for control of the output current and voltage to protect against overload conditions. For this purpose the power output circuit 80 is connected to a current sensing circuit 160 which detects the energy level of the output voltage and current from the power output circuit 80 and, when the energy level of the output waveform exceeds a predetermined level, the current sensing circuit 160 generates an output signal which is fed through a current-limiting network 170 to a dynamic threshhold adjustment component in the pulse width control network 140 for raising the threshhold level, thereby reducing the widths of the output pulses, and thereby reducing the average voltage and current from the power output circuit 80.

It is important that the output frequency of the ultrasonic generator 40 match the mechanical resonance of the particular transducer/horn assembly used for a particular welding application. Thus, a feedback signal is fed from the matching network 90 via the conductor 95 through a bandpass amplifier circuit 180 to the triangle wave generator 110 via conductor 113 for synchronizing the free-running frequency thereof to the frequency of operation of the transducer/horn assembly 50. The feedback signal is fed to the non-inverting input of the bandpass amplifier circuit 180. Connected from the output conductor 113 to the inverting input of the bandpass amplifier circuit 180 is a phase adjusting network 185 including a variable capacitor and an inductor which form a parallel resonant network at the predetermined optimum operating frequency of the system. This phase adjustment control is set to achieve maximum power transfer to the transducer at no-load conditions. As long as the system is operating at this predetermined frequency at which the phase adjusting network 185 is resonant, there will be a minimal feedback signal around the bandpass amplifier circuit 180. But when the operating frequency of the transducer/horn assembly 50 begins to shift from the center frequency of the bandpass amplifier circuit 180, the increase in feedback signal through the phase adjusting network will reduce the gain of the bandpass amplifier circuit 180, thereby preventing the triangle wave generator from locking onto frequencies outside a desired passband.

Figure 2A:
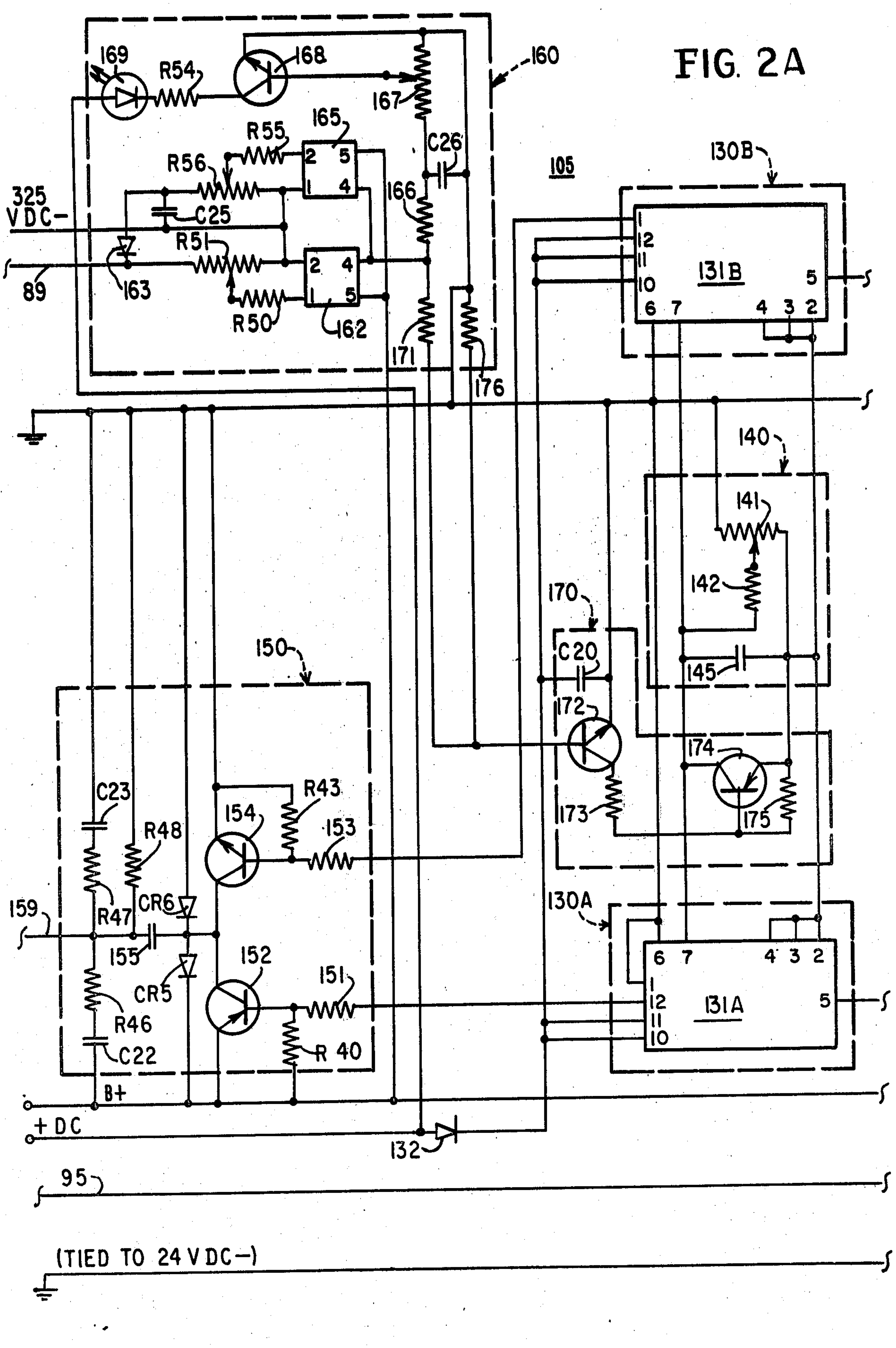
FIGS. 2A and 2B are two halves of a schematic circuit diagram of the portion of the ultrasonic generator enclosed within the dashed line in FIG. 1.
Figure 2B:
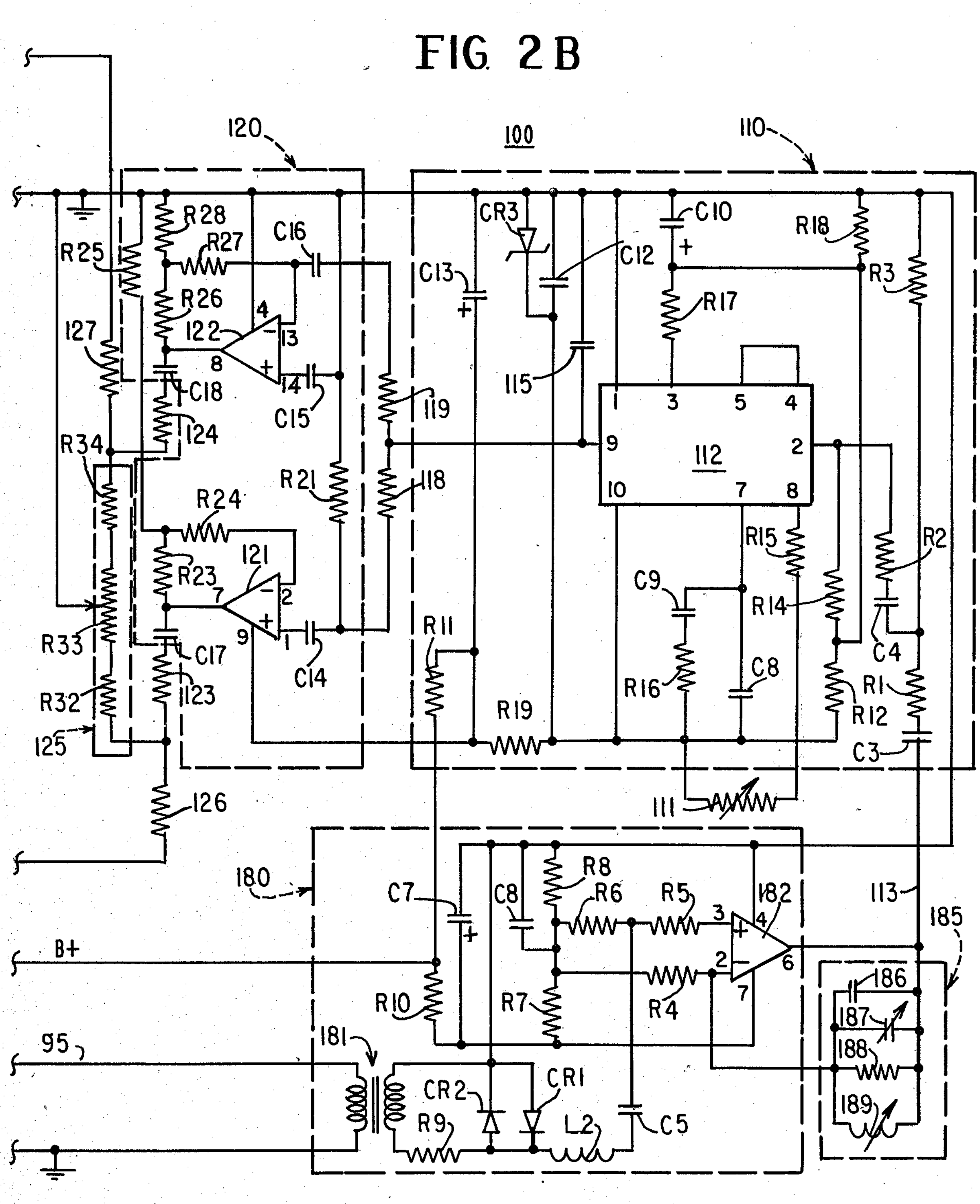

Referring now to FIGS. 2A and 2B of the drawings, the frequency control circuit 100 and the current control circuit 105 will be described in detail. These figures are to be read side-by-side with FIG. 2A on the left-hand side. The triangle waveform generator 110 comprises a phase locked loop integrated circuit 112 which is connected in circuit with a plurality of peripheral components, including resistors R1, R2, R3 and R11–R19, capacitors C3, C4 and C8–C13 and Zener diode CR3, in a configuration for producing at the output thereof a linear triangle wave with in-phase zero crossings. The integrated circuit 112 includes a stable, highly linear voltage-controlled oscillator, a phase detector and an amplifier. The free-running frequency of the oscillator is controlled by a resistor R15 and the variable resistor 111 connected to pin 8, and a timing capacitor 115 connected to pin 9. The output of the voltage-controlled oscillator at pin 4 is fed to the phase detector at pin 5. The synchronizing signal on the conductor 113 at the output of the bandpass amplifier circuit 180 is applied to pin 2 of the IC 112 through a coupling network including a capacitor C3, a resistor R1, a capacitor C4 and a resistor R2, the junction between the resistor R1 and the capacitor C4 being connected to ground through a resistor R3.

The phase detector output represents a control voltage which is amplified and fed to a control terminal of the voltage-controlled oscillator internally of the integrated circuit 112 for synchronizing the frequency of operation of the voltage-controlled oscillator to the frequency of the feedback signal on the conductor 113. This amplified control signal also appears at pin 7 and is filtered by the resistor R16 and capacitors C8 and C9. A supply voltage of approximately +24 VDC from the power supply 55 is applied through resistors R11 and R19 to the pin 10 of the integrated circuit 112. Pin 1 is grounded and pin 3 is connected to ground through resistors R17 and R18, the latter being shunted by a bypass capacitor C10. The junction between the resistors R17 and R18 is connected through a resistor R14 to pin 2 and through a resistor R12 to pin 10. The terminals of the resistor R19 are respectively connected to ground through bypass capacitors C12 and C13, the former being shunted by a Zener diode CR3. The synchronized triangle wave output of the voltage-controlled oscillator appears at the pin 9 and is applied through the resistors 118 and 119 to the dual preamplifier 120.

The dual preamplifier 120 includes two completely independent operational amplifiers 121 and 122 in a single integrated circuit, with both amplifiers operating from a single +24 VDC supply applied at pin 9. The triangle waveform is applied through a coupling capacitor C14 to the non-inverting input of the amplifier 121 at pin 1 and is simultaneously applied through a coupling capacitor C16 to the inverting input of amplifier 122 at pin 13. The non-inverting input of the amplifier 122 at pin 14 is connected through a capacitor C15 to ground and to a resistor R21 which is in turn connected to the junction between the resistor 118 and the capacitor C14. The output of the amplifier 121 appears at pin 7 and constitutes a triangle waveform in phase with that applied at the input of the amplifier 121, this output waveform being fed through a coupling capacitor C17 and the resistor 123 to the symmetry adjustment network 125, which includes resistors R32 and R34 and a potentiometer R33. Similarly, the output from the amplifier 122 appears at pin 8 and comprises a triangle waveform which is inverted, i.e., 180 degrees out of phase with that applied at the input of the amplifier 122, this output waveform being fed through a coupling capacitor C18 and the resistor 124 to the symmetry adjustment network 125. The pin 7 of the amplifier 121 is connected back to the inverting input thereof at pin 2 through the resistors R23 and R24, the junction between these resistors being connected to ground through the resistor R25. The output of the amplifier 122 at pin 8 is connected back to the inverting input thereof at pin 13 through the resistors R26 and R27, the junction between these resistors being connected to ground through the resistor R28.

The non-inverted triangle waveform is fed through the resistor 126 to the pulse generator circuit 130A, while the inverted triangle waveform is fed through the resistor 127 to the input of the pulse generator 130B. The pulse generators 130A and 130B, respectively, comprise identical integrated circuits (IC's) 131A and 131B, connected to operate as comparators. Each of the integrated circuits 131A and 131B has a floating transistor output with the emitter at pin 1 and the collector at pin 12. The 24 VDC supply voltage switched from the power supply 55 is applied through a diode 132 to pins 10 and 11 of each of the IC's 131A and 131B this voltage also being applied to pin 12 of the IC 131B, and being connected to ground through a bypass capacitor C20. A reference voltage appears at the pins 4 of the two comparator IC's, which pins are tied together. The threshhold level of each comparator IC is controlled by the voltage applied to the pin 7, these pins of the two IC's 131A and 131B being tied together so that the two IC's will have the same threshhold levels. A variable portion of the reference voltage at the pins 4 is applied to the pins 7 through a voltage divider including a variable resistor 141 and a fixed resistor 142.

Each of the IC's 131A and 131B reacts to the rising edge of the input triangle waveform for initiating a square wave output pulse when the rising edge of the triangle waveform crosses a predetermined threshhold level, the output square wave pulse being terminated when the falling or trailing edge of the triangle wave trigger signal again crosses the threshhold voltage level. Thus, it will be appreciated that the higher the threshhold voltage level, the narrower the output pulse. The emitter of the output transistor of the IC 131A at pin 1 is grounded and the output signal is taken from the collector at pin 12. Thus, each rising edge of the non-inverted triangle waveform will produce a "logic low" pulse at the output of the timer IC 131A. The IC 131B has the collector of its output transistor at pin 12 connected to the DC voltage supply, with the output taken from the emitter at pin 1. Thus, each rising edge of the triangle waveform applied to IC 131B will produce a "logic high" pulse at the output thereof. The pulses at the output of the IC 131B will be 180 degrees out of phase with those of the output of the IC 131A, because of the 180-degree phase separation between the triangle waveforms at the inputs thereof. The variable resistor 141 of the pulse width control network 140 is initially adjusted so that the width of each output pulse will be less than 180 degrees to provide the "dead time" between pulses, as will be explained more fully below.

During start-up of the ultrasonic generator 40, there is a high current demand on the power output circuit 80. Therefore, to avoid an overload during this start-up period, there is also provided a starting capacitor 145 which is connected across the resistors 141 and 142. The charging of the capacitor 145 permits the voltage drop across the resistors 141 and 142 to build up gradually to the steady-state condition, thereby gradually decreasing the threshhold level and gradually increasing the width of the output pulses from the IC's 131A and 131B, as indicated in the waveform diagram of FIG. 5A.

The "logic high" and "logic low" pulse trains at the outputs of the IC's 131B and 131A are both fed to the pulse output circuit 150, where they are combined into a single pulse train waveform. More particularly, the output of the IC 131A is applied through a resistor 151 to the base of a PNP transistor 152, while the output of the IC 131B is applied through a resistor 153 to the base of an NPN transistor 154. A resistor R40 is connected between the emitter and base of the transistor 152 and a resistor R43 is connected between the emitter and base of the transistor 154. The emitter of the transistor 152 is connected to the +24 VDC supply, while the emitter of the transistor 154 is grounded, the collectors of the two transistors being joined together at a common output terminal which is connected through a coupling capacitor 155 to the conductor 159. The complementary transistors 152 and 154 are alternately switched on by the incoming pulse trains, the transistor 152 producing a "logic high" output pulse in response to each input pulse, and the transistor 154 producing a "logic low" output pulse in response to each input pulse, for producing at the output terminal a bipolar pulse train. Also connected in circuit with the output of the transistors 152 and 154 is damping and clamping circuitry to damp out switching spikes in the voltage waveform, this circuitry including diodes CR5 and CR6, resistors R46, R47 and R48 and capacitors C22 and C23.

Figure 3:
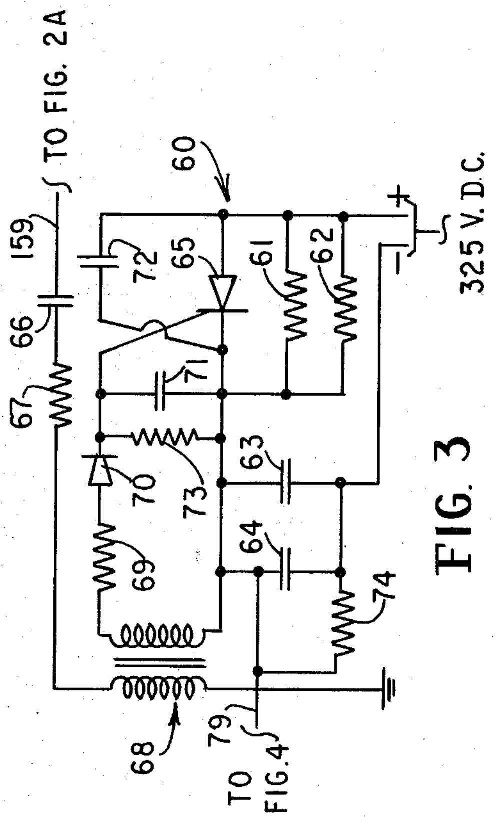
FIG. 3 is a schematic circuit diagram of the circuitry within the "Current Inrush Limiting" block of FIG. 1.

The output pulse train on the conductor 159 is applied to the current inrush limiting circuit 60. Referring to FIG. 3 of the drawings, the current inrush limiting circuit 60 includes a storage capacitor and charging network connected across the terminals of the 325 VDC supply voltage from the power supply 55, this network including two parallel charging resistors 61 and 62 connected in series with two parallel storage capacitors 63 and 64. The positive terminals of the capacitors 63 and 64 are connected to the power output circuit 80 via the conductor 79. The capacitors 63 and 64 are of large capacity, preferably each being an 1100-microfarad, 450-volt capacitor. The charging resistors 61 and 62 provide for gradual charging of these capacitors during initial AC turn-on of the system, to avoid unduly large starting currents which would trip the circuit breakers in the system.

Once the ultrasonic generator 40 is operative and is producing an ultrasonic-frequency output signal, it is desirable to remove the charging resistors 61 and 62 from the circuit, since they dissipate considerable energy and would be wasteful during steady-state operation. Accordingly, there is connected in parallel with the resistors 61 and 62 a silicon controlled rectifier (SCR) 65 having its anode connected to the +325 VDC supply and its cathode connected to the positive plates of the capacitors 63 and 64. In order to trigger the SCR 65 into conduction, the pulse output signal on the conductor 159 is applied through a coupling capacitor 66 and a resistor 67 to the primary winding of a transformer 68. The secondary winding of the transformer 68 has one terminal thereof connected to the cathode of the SCR 65, and the other terminal thereof connected through a resistor 69 and diode 70 to the control electrode of the SCR 65.

In operation, when the square wave ultrasonic pulse train appears on the conductor 159, the SCR 65 is triggered to its conductive condition for shorting out the charging resistors 61 and 62, the SCR 65 remaining in its conductive condition as long as the current through the SCR 65 exceeds its holding value. The circuit 60 also includes bypass capacitors 71 and 72 to prevent false operation of the SCR 65 in the event of spurious voltage spikes or the like on the conductor 159. Also, a resistor 73 is connected between the cathode and gate of the SCR 65, and a bleeder resistor 74 is connected across the storage capacitors 63 and 64.

Figure 4:
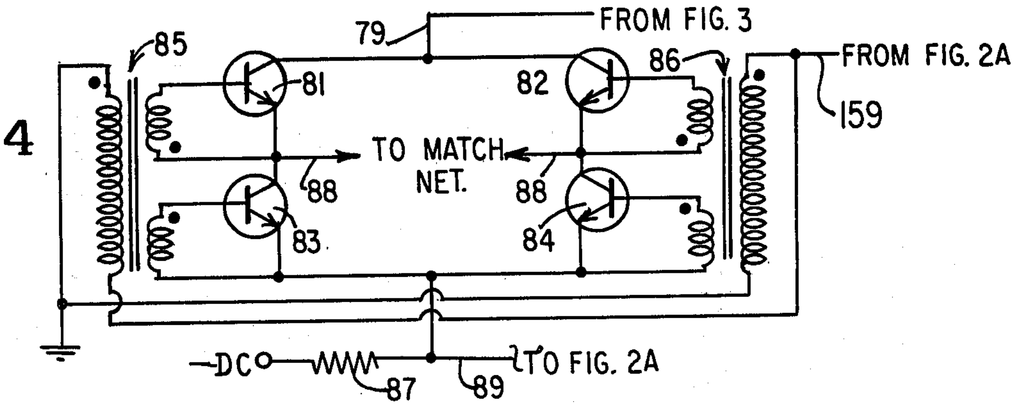
FIG. 4 is a simplified schematic circuit diagram of the type of circuitry utilized in the power output block of FIG. 1.
Figure 4:
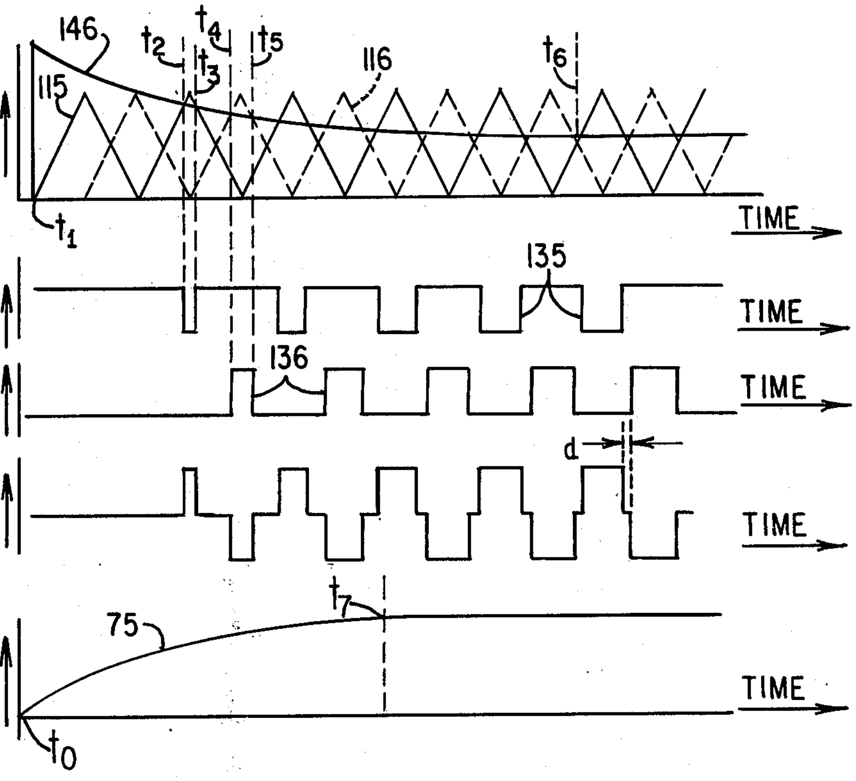
Figure 4:
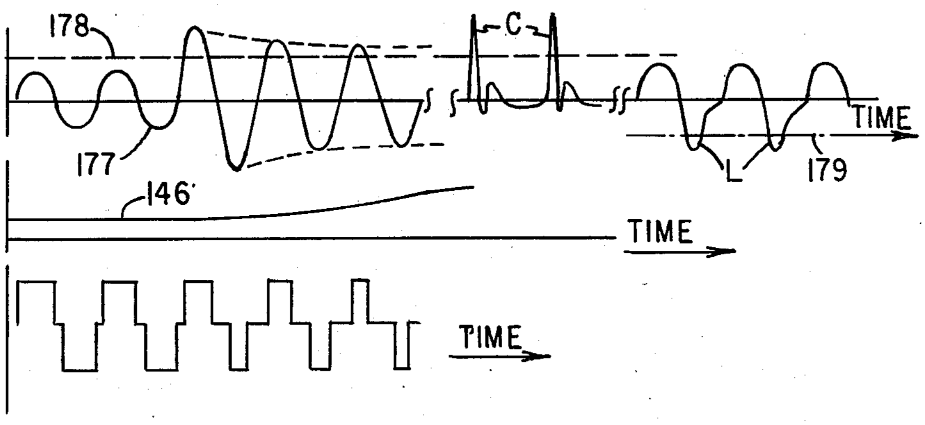

Referring now to FIG. 4 of the drawings, there is illustrated a simplified schematic diagram of the type of transistor bridge inverter arrangement utilized in the power output circuit 80. The bridge inverter includes four NPN transistors 81, 82, 83 and 84, the conductor 79 being connected to the collectors of the transistors 81 and 82, with the emitters of these transistors being respectively connected to the collectors of the transistors 83 and 84, the emitters of which are connected to negative DC through a resistor 87. The output from the bridge circuit, which is fed to the matching bridge circuit 90 via the conductor 88, is taken at the emitters of the transistors 81 and 82.

The bipolar pulse waveform on the conductor 159 from the pulse output circuit 150 is applied in opposite phases but in parallel to the primary windings of two transformers 85 and 86. Each of these transformers has two secondary windings, with each secondary winding being connected between the base and emitter of an associated one of the transistors 81–84. Thus, the secondary windings of the transformer 85 are connected to the bases of the transistors 81 and 83 while the secondary windings of the transformer 86 are connected to the bases of the transistors 82 and 84. The windings are so arranged that positive-going pulses will trigger the transistors 81 and 84 into conduction for completing a current path in one direction through the load, and opposite phase pulses will trigger the transistors 82 and 83 into conduction for providing a current path in the opposite direction through the load. Thus, there will be produced at the output terminals 88 an alternating voltage at an ultrasonic frequency corresponding to the pulse repetition rate of the bipolar pulse waveform.

Each of the transistors 81–84 has a certain inherent storage time such that when the control voltage is removed from the base, the collector-emitter junction will remain conductive for a predetermined short period of time. Thus, for example, if a control pulse is applied to the base of the transistor 84 simultaneously with the removal of control voltage from the base of the transistor 82, the transistor 84 will become conductive substantially instantaneously and the transistor 82 will remain conductive for a predetermined short time during which there will be a short circuit across the power supply through the transistors 82 and 84, resulting in extremely high current flow which can easily burn out the power transistors 82 and 84 or at least cause serious overheating thereof.

In order to prevent this condition, a predetermined "dead time" is provided between the alternate phase pulses in the bipolar pulse wave form. Thus, as was indicated above in connection with the description of the pulse width control network 140, the variable resistor 141 is set to provide a pulse width such that the "dead time" between adjacent pulses will be at least as great as the storage time of the power transistors 81–84. Referring to the waveform of FIG. 5D, this "dead time" "d" is readily apparent and it will be appreciated that this effectively prevents any overlap in the conduction of any two of the transistors 81–84 between which there is a direct connection from the emitter of one transistor to the collector of the other. It will also be well understood that the time that each transistor 81–84 is conductive is directly proportional to the width of the control pulse applied to its base and that, therefore, the average value of the output voltage and current waveforms at the output terminals 88 of the bridge is proportional to the width of the control pulses.

It is an important feature of the present invention that this pulse width modulation control capability of the present invention affords an effective means for compensating for current overloads in the output circuitry. Such overloads can result from a number of causes. Thus, it might be attempted to utilize the ultrasonic generator 40 for driving a load which exceeds the capacity of the generator, thereby increasing the amplitude of the output current. Also, an overload condition can result from a mistuning of the load. Thus, if the transducer/horn assembly 50 and the load coupled thereto becomes reactive rather than purely resistive, the efficiency of the system is reduced and more energy is dissipated. More specifically, when there is a capacitive overload condition, there will be a very high amplitude positive-going spike C at the beginning of each cycle of the output waveform from the power output circuit 80 and, if the load is inductive, there will be a lower amplitude but wider and negative-going spike L at the beginning of each half cycle, as indicated in FIG. 6A. While the negative-going inductive overload spikes L are of considerably smaller amplitude than the capacitive overload spikes C, they have approximately the same energy content because of their greater width and, therefore, both types of mistuning conditions can cause dangerous overloads which should be protected against.

Thus, there is provided a current sensing circuit 160 for detecting when the energy level in the positive or negative half cycles of the output current from the power output circuit 80 exceeds predetermined levels. In this regard, the voltage across the resistor 87 (FIG. 4) is applied via the conductor 89 to the current sensing circuit 160 as an indication of the output voltage and current. Referring to FIG. 2A, the voltage across the resistor 87 (FIG. 4) is applied via conductor 89 to one terminal of a variable resistor R51, the other terminal of which is connected to the negative input terminal of an optically-coupled isolator ("opto-isolator") 162 at pin 2, the wiper of the resistor R51 being connected through a resistor R50 to the positive input terminal of the opto-isolator 162 at pin 1. The voltage on the conductor 89 is also applied through a diode 163 to one terminal of a variable resistor R56, the other terminal of which is connected to the positive input terminal of an opto-isolator 165 at pin 1, the wiper of the resistor R56 being connected through a resistor R55 to the negative input terminal of the opto-isolator 165 at pin 2. A +24 VDC supply voltage is applied to each of the opto-isolators 162 and 165 at the pins 5 thereof, the output signals therefrom being taken from the pins 4 and being applied through a fixed resistor 166 and a variable resistor 167 to the base of a transistor 168, the emitter of which is grounded and the collector of which is connected through a resistor R54 and a light emitting diode (LED) 169 to a +24 VDC switched supply voltage. The anode of the diode 163 is connected to negative DC through a bypass capacitor C25, and the junction between the fixed and variable resistors 167 and 166 is also connected to ground through a bypass capacitor C26.

In operation, each of the opto-isolators 162 and 165 is responsive to an input signal energy level which exceeds a predetermined threshhold energy level determined by the settings of the variable resistors R51 and R56. The threshhold level 178 of the opto-isolator 162 is such as to protect against simple current overloads as would result from an unduly high amplitude output current, as indicated in FIG. 6A. This threshhold level 178 will also be exceeded in the event of a capacitive mistuning condition since, while the voltage spikes C resulting from them are very narrow, they have extremely high amplitude and, therefore, the energy content is sufficient to energize the opto-isolator 162. The threshhold level 179 of the opto-isolator 165 is set to detect inductive mistuning.

Thus, in the event of a current overload or a capacitive mistuning condition, the opto-isolator 162 will produce an output signal at pin 4 which is proportional to the extent that the input signal thereof exceeds the threshold level. Likewise, the variable output signal on pin 4 of the opto-isolator 165 will be produced in the event of an inductive mistuning condition. In either case, the output signal is applied to the base of the transistor 168 for switching it to the conductive condition, thereby energizing the LED 169 to give a visual signal that an overload condition exists. Typically, the LED 169 would be positioned on the front panel of the housing of the ultrasonic generator 40 so as to be readily visible by an operator.

This output signal from either or both of the opto-isolators 162 and 165 is also applied to the current-limiting network 170. More particularly, this signal is applied through a resistor 171 to the base of a transistor 172, the emitter of which is grounded and the collector of which is connected through a resistor 173 to the base of a transistor 174. The emitter and collector of the transistor 174 are respectively connected to the pins 4 and 7 of the timer IC's 131A and 131B. A resistor 175 is connected across the base-emitter junction of the transistor 174, while a resistor 176 is connected across the base-emitter junction of the transistor 172.

In operation, the output signals from the opto-isolators 162 and 165 cause a conduction through the emitter-collector junction of the transistor 172 which is proportional to the magnitude of the opto-isolator output signal. The resulting base current of the transistor

174 causes conduction through its emitter-collector junction which is proportional to the base current.

In other words, the transistor 174 operates as a variable impedance between the reference voltage source at the pins 4 of the IC's 131A and 131B, and the threshhold setting pin 7. As the base current of the transistor 174 increases, the impedance of the emitter-collector junction is decreased, for applying a greater percentage of the reference voltage at pin 4 to the threshold adjusting pin 7. As this voltage applied to the pin 7 increases, the threshhold level rises and the width of the output pulses decreases for decreasing the average output current from the generator 40.

An important advantage of the current sensing circuit 160 and the current-limiting network 170 is that they are extremely fast-acting in responding to an overload condition for effecting a downward correction in the output current level. When the overload condition ceases, the output signal from the opto-isolators 162 and 165 ceases, the transistors 172 and 174 turn off.

The frequency of operation of the triangle wave generator 110 is synchronized to the operating frequency of the transducer/horn assembly 50 by means of a feedback signal on the conductor 95. This signal is applied to the primary winding of a transformer 181 in the bandpass amplifier circuit 180. The secondary of the transistor 181 is connected through a resistor R9, an inductor L2, a capacitor C5 and a resistor R5 to the non-inverting input of an integrated circuit operational amplifier 182. The junction between the resistor R9 and the inductor L2 is connected to ground through a parallel combination of oppositely-connected diodes CR1 and CR2. The junction between the capacitor C5 and the resistor R5 is connected to ground through resistors R6 and R8, the latter being shunted by a bypass capacitor C8. The junction between the resistors R6 and R8 is connected via a resistor R7 to the DC supply and via a resistor R4 to pin 2, the inverting input of the amplifier 182. The DC supply voltage for the operational amplifier 182 is supplied to the pin 7 thereof through a resistor R10, a bypass capacitor C7 being connected between the pin 7 and ground. The output from the operational amplifier 182 is taken at the pin 6 and is fed back to the inverting input thereof at pin 2 through the phase-adjusting network 185, which comprises a parallel resonant network including a fixed capacitor 186, a variable capacitor 187, a resistor 188 and a variable inductor 189.

The phase adjusting network 185 is tuned to balance out the phase shift introduced in the rest of the system, including the ultrasonic generator 40 and the transducer/horn assembly 50, at no-load conditions. In other words, the phase adjusting network 185 is adjusted to obtain maximum output and power transfer or minimum standing wave for a particular horn, the resonant frequency of the phase adjusting network 185 being the center frequency of the bandpass window of the operational amplifier 182.

When the system is operating at the intended operating frequency of resonance of the phase adjusting network 185, it presents a high impedance, providing minimal feedback to the pin 2, and thereby maintaining the gain of the operational amplifier 182 unaffected. As the frequency of operation of the transducer/horn assembly 50 shifts to either side of the center frequency, the impedance of the parallel resonant phase adjusting network 185 decreases, providing a feedback signal to the inverting input of the operational amplifier 182, thereby decreasing the gain of the amplifier, but not affecting the frequency of the feedback signal from the transducer/horn assembly 50 being amplified thereby.

Thus, the phase adjusting network 185 permits adjustment of the system for a particular operating phase and frequency, but does not dissipate significant power in the feedback loop of the ultrasonic generator 40, and permits the phase and frequency information in the feedback signal to be transmitted unaltered to the triangle wave generator 110. If the frequency of operation of the transducer/horn assembly 50 deviates sufficiently that it falls outside the bandpass window of the operational amplifier 182, the output signal therefrom will be of insufficient amplitude for synchronizing the triangle wave generator 110. This bandpass window is set so that the system responds to only a desired resonant frequency of the transducer/horn assembly 50, and will not respond to other resonant modes of the transducer/horn assembly 50.

Referring now also to FIGS. 5 and 6 of the drawings, the operation of the ultrasonic generator 40 will now be described in detail. When the ultrasonic generator 40 is turned on, the triangle wave generator 110 produces at its output a triangle waveform at the free-running frequency determined by the variable resistor 111. Non-inverted and inverted forms of this triangle waveform are produced at the output of the dual preamplifier 120 and are respectively designated by the numerals 115 and 116 in FIG. 5A, these waveforms being respectively supplied to the pulse generators 130A and 130B.

At the start-up of the ultrasonic generator 40, the voltage on the pins 7 of the IC's 131A and 131B is initially substantially the full reference voltage derived from the pins 4, this voltage being directly proportional to the threshhold level of the voltage generators 130A and 130B, which threshhold level is designated by the curve 146 in 5A. By reason of the action of the capacitor 145 in the pulse width control network 140, this threshhold level gradually decreases from the start-up time $t_1$ to a steady-state condition at time $t_6$, this steady-state voltage level being determined by the setting of the variable resistor 141. When the threshhold level 146 has dropped sufficiently, it is intersected at time $t_2$ by the rising edge of the non-inverted triangle waveform 115 for instituting at the output of the pulse generator 130A a square wave pulse 135, illustrated in FIG. 5B, which pulse terminates at time $t_3$ when the falling edge of the triangle waveform 115 again intersects the threshhold level 146. In like manner, when a rising edge of the inverted triangle waveform 116 intersects the threshhold level 146 at time $t_4$, a square wave output pulse 136 is initiated by the pulse generator 130B, as illustrated in FIG. 5C, this pulse being terminated at time $t_5$ when the trailing edge of the triangle waveform 116 intersects the threshhold level 146.

It will, therefore, be understood that as the threshhold level 146 continues to decrease, there will be produced at the outputs of the pulse generators 130A and 130B, two trains of pulses 135 and 136 of gradually increasing widths. After the time $t_6$, when the steady-state condition of the threshhold level is reached, the pulses 135 and 136 will all be of constant width. This gradual increase in pulse width serves to prevent overloading of the oscillatory circuitry during start-up of the ultrasonic generator 40.

The pulse trains 135 and 136 are combined in the pulse output network 150 to form the bipolar waveform illustrated in FIG. 5D. The steady-state threshhold level, as determined by the setting of the variable resistor 141, is adjusted so that it is a predetermined amount greater than half of the peak amplitude of the triangle waveforms 115 and 116, as illustrated in FIG. 5A. As a result of this minimum threshhold level, the maximum width or "on" time of each of the pulses 135 and 136 will be less than the "off" time between pulses, resulting in a predetermined "dead time" designated by the letter "d" in FIG. 5D. As has been indicated above, this "dead time" is adjusted to be equal to or greater than the maximum storage time of the power transistors 81–84 in the power output circuit 80 to prevent short-circuiting of the power supply through the bridge inverter circuit. Thus, the conduction of each of the transistors 81 and 84 triggered by each positive-going pulse 135, will have completely terminated before conduction of the transistors 82 and 83 is initiated by the following opposite phase, but positive pulse 136, and vice versa.

When AC power is initially applied to the ultrasonic generator 40, the current inrush limiting circuit 60 is also operative to limit the DC charging current to the filter capacitors associated with the power supply. Thus, referring to FIG. 5E, the voltage across the capacitors 63 and 64, which appears on the conductor 79 and is designated by the curve 75, will gradually increase, by reason of the charging resistors 61 and 62 from the AC turn-on time $t_0$ until the capacitors are fully charged at time $t_7$. At time $t_7$, if the bipolar waveform from the pulse output circuit 150 is present, a voltage will be induced in the secondary winding of the transformer 68 for triggering the SCR 65 into conduction, thereby shorting out the charging resistors 61 and 62. The gradual increase in the charging current for the capacitors 63 and 64 during AC turn-on prevents high current loads which might trip the circuit breakers in the power supply 55.

As a result of the gradual increase in pulse width from the pulse generators 130A and 130B during start-up (see FIG. 5D), there will be a corresponding gradual increase in the duty cycle of the output signal from the power output circuit 80 on the conductor 88.

During normal operation of the ultrasonic generator 40, the transducer/horn assembly 50 will operate, when unloaded, at a mechanical resonant frequency which is the same as the frequency of the output voltage from the power output circuit 80 on the conductor 88. While the transducer/horn assembly 50 may have other mechanical resonances, particularly in the case of a large horn, the bandpass amplifier circuit 180 is tuned to reject these other resonant frequencies since they do not provide optimum displacement of the transducer/horn assembly 50. More particularly, the parallel resonant phase adjusting network 185 is tuned to be resonant at the desired operating frequency so as to provide a very high impedance in the feedback path around the operational amplifier IC 182 at that resonant frequency. Thus, at the desired resonance there will be minimal feedback signal and the gain of the operational amplifier 182 will be unaffected.

The phase adjusting network 185 is so arranged as to provide approximately 10 DB attenuation at frequencies 500 Hz on either side of the center frequency. Thus, the bandpass amplifier circuit 180 has a passband "window" of frequencies which will be of sufficient amplitude to synch the phase locked loop IC 112 of the triangle wave generator 110. As the frequency of operation of the transducer/horn assembly 50 varies within that window, the frequency of the triangle waveform output from the triangle wave generator 110 will follow that frequency for maximum efficiency of operation. This arrangement has important operating advantages, since it permits the frequency and phase information of the feedback signals on the conductor 95 to be passed substantially unaltered to the triangle wave generator 110, only the amplitude of the feedback signal being affected by the bandpass amplifier circuit 180.

It is an important feature of the present invention that the ultrasonic generator 40 is protected from overload conditions during normal operation, as well as during start-up. If the transducer/horn assembly 50 is overloaded, the power output circuit 80 may begin to draw excessive current which could be damaging to the system components. In order to prevent such damage, the overload condition is detected by the current sensing circuit 160, which in turn causes the current limiting network 170 to override the pulse width control network 140 and reduce the widths of the control pulses, thereby reducing the average output current from the power output circuit 80.

Referring to FIG. 6A of the drawings, there is illustrated a plot of the output current from the power output circuit 80, this waveform being designated by the numeral 177. As the amplitude of the current output waveform results in an energy level which exceeds a predetermined threshhold, diagrammatically designated by the numeral 178, this threshhold being determined by the setting of the variable resistance R51, the opto-isolator 162 will produce an output on its pin 4 which is proportional to the amount that the energy in the current waveform 177 exceeds the threshhold level 178. If this output signal exceeds a level predetermined by the setting of the variable resistor 167, it will trigger the transistor 168 into conduction, thereby illuminating the LED 169 to give an indication to the operator that the system is in an overload condition. A persistent or protracted illumination of the LED 169 would alert the operator to investigate the cause of the overload condition.

The output signal from the opto-isolator 162 also turns on the transistor 172 to a conductive condition, the impedance of the collector-emitter junction of this transistor being inversely proportional to the amplitude of the signal applied to the base. This conduction in turn results in a base signal in the transistor 174 which turns it on to a conductive condition, the impedance of the collector-emitter junction of the transistor 174 also being inversely proportional to the magnitude of the signal on the base. Thus, it will be appreciated that the conduction of the transistor 174 has the effect of inserting an impedance in parallel with the resistors 141 and 142, thereby reducing the net impedance between the pins 4 and 7 and increasing the voltage on the pins 7 for increasing the threshhold level 146 of the pulse generators 130A and 130B, as illustrated in FIG. 6B. This results in a reduction in the width of the output pulses from the pulse output network 150, as illustrated in FIG. 6C. As the widths of the output pulses from the pulse output network 150 are reduced, they result in a proportional reduction in the amplitude of the output waveform 177 from the matching network 90, as illustrated in FIG. 6A. This amplitude will be decreased until the energy level of the output signal reaches a predetermined safe level. When the overload condition is remedied, the output signal from the opto-isolator 162 will cease, the transistors 172 and 174 will be turned off and the threshhold level 146 of the pulse generators 130A and 130B will return to the steady-state condition determined by the pulse width control network 140.

Overload conditions can also result from a mistuning of the transducer/horn assembly 50. Ideally, the vibrating system, including the transducer/horn assembly 50 and the associated work, will present a purely resistive load to the ultrasonic generator 40. But in operation the load may become reactive, either capacitive or inductive. Referring to the central portion of FIG. 6A, a capacitive mistuning of the load will cause very high amplitude, narrow, positive-going spikes C to appear at the beginning of each positive half cycle of the output waveform, while an inductive mistuning of the load will cause a smaller amplitude but broader negative-going spike L at the beginning of each negative half cycle of the output waveform, as illustrated in the righthand portion of FIG. 6A.

Because of the extremely high amplitude of the spikes C resulting from a capacitive mistuning of the load, the energy level in these spikes will be sufficient to exceed the threshhold level 178, thereby causing an output signal to be generated by the opto-isolator 162 for driving the current limiting network 170 and reducing the duty cycle of the output waveform 177, in the same manner as was described above with respect to a simple resistive overload condition. The opto-isolator 165 has a different threshhold level diagrammatically designated 179 in FIG. 6A, determined by the setting of the variable resistor R56, which is exceeded by the energy in the negative-going spikes L in the event of an inductive mistuning condition. Thus, an inductive mistuning will produce an output signal from the opto-isolator 165 on its pin 4, which will cause the current limiting network 170 to reduce the width of the output pulses from the pulse generators 130A and 130B, thereby reducing the duty cycle of the output waveform 177 from the power output circuit 80 in the same manner as was described above.

In a constructional model of the ultrasonic generator 40 of the present invention, component items having the description or values indicated below may be used. Unless otherwise noted, all resistors are rated at 0.5 watt and 5% tolerance.

| Item | Description |
|---|---|
| R1 | 3300 ohms |
| R2 | 10K ohms |
| R3 | 1000 ohms |
| R4 | 6800 ohms |
| R5 | 6800 ohms |
| R6 | 47 ohms |
| R7 | 220K ohms |
| R8 | 220K ohms |
| R9 | 1000 ohms |
| R10 | 560 ohms |
| R11 | 330 ohms, 1W, 10% |
| R12 | 10K ohms |
| R14 | 4700 ohms |
| R15 | 4300 ohms |
| R16 | 1000 ohms |
| R17 | 4700 ohms |
| R18 | 4700 ohms |
| R19 | 100 ohms |
| R21 | 100K ohms |
| R23 | 220K ohms |
| R24 | 22K ohms |
| R25 | 56K ohms |
| R26 | 220K ohms |
| R27 | 6800 ohms |
| R28 | 56K ohms |
| R32 | 10K ohms |
| R33 | 10K ohms |

-continued

| Item | Description |
|---|---|
| R34 | 10K ohms |
| R40 | 220 ohms |
| R43 | 220 ohms |
| R46 | 330 ohms, 1W, 10% |
| R47 | 330 ohms, 1W, 10% |
| R48 | 150 ohms, 2W, 10% |
| R50 | 18 ohms |
| R51 | 1000 ohms |
| R54 | 1800 ohms |
| R55 | 33 ohms |
| R56 | 1000 ohms |
| C3 | .1 uf |
| C4 | .0047 uf |
| C5 | .015 uf |
| C6 | 5 uf, 25V |
| C7 | 50 uf, 50V |
| C8 | .01 uf |
| C9 | .1 uf |
| C10 | 5 uf, 25V |
| C12 | 50 uf, 50V |
| C13 | 50 uf, 50V |
| C14 | .01 uf |
| C15 | .01 uf |
| C16 | .01 uf |
| C17 | .01 uf |
| C18 | .01 uf |
| C20 | .01 uf |
| C22 | .05 uf |
| C23 | .05 uf |
| C25 | .1 uf |
| C26 | .001 uf |
| L2 | 2.6 mh |
| 61 | 50 ohms, 10W |
| 62 | 50 ohms, 10W |
| 63 | 1100 uf, 450V |
| 64 | 1100 uf, 450V |
| 66 | .05 uf |
| 67 | 330 ohms |
| 69 | 10 ohms |
| 71 | .1 uf |
| 72 | .1 uf |
| 73 | 1000 ohms |
| 74 | 25K ohms, 10W |
| 81 | MJ10005 |
| 82 | Same as 81 |
| 83 | Same as 81 |
| 84 | Same as 81 |
| 87 | .2 ohms, 25W, 1% |
| 111 | 1000 ohms |
| 112 | LM565CN |
| 113 | 3000 pf |
| 118 | 100K ohms |
| 119 | 100K ohms |
| 121, 122 | LM381N |
| 123 | 8200 ohms |
| 124 | 8200 ohms |
| 126 | 22K ohms |
| 127 | 22K ohms |
| 131A | LM322N |
| 131B | LM322N |
| 141 | 2500 ohms |
| 142 | 4700 ohms |
| 145 | 2.2 uf, 35V |
| 151 | 680 ohms, 2W, 10% |
| 152 | MJE2955 |
| 153 | 680 ohms, 2W, 10% |
| 154 | MJE2801K |
| 155 | 2 uf |
| 162 | FCD820 |
| 165 | FCD820 |
| 166 | 4700 ohms |
| 167 | 10K ohms |
| 168 | MPS-6566 |
| 171 | 3300 ohms |
| 172 | MPS-6566 |
| 173 | 2200 ohms |
| 174 | MPS-6518 |
| 175 | 2200 ohms |
| 176 | 560 ohms |
| 172 | MC1741SCP |
| 186 | 8200 pf |

-continued

| Item | Description |
|---|---|
| 188 | 100K ohms |
| 189 | 6.2 mh |

From the foregoing, it can be seen that there has been provided an improved high power ultrasonic generator which is of compact construction and efficient operation, which permits accurate synchronizing of the generator frequency to the frequency of operation of the transducer/horn assembly without undesirable phase shift, and which affords effective protection of the system components from overload conditions.

While the invention has been disclosed as including a power output circuit 80 which utilizes a full bridge inverter (FIG. 4), it will be appreciated that, depending upon the power requirements of a particular application, the power output circuit could utilize a half-bridge (only two transistors), a double-bridge (eight transistors), push-pull drivers or other known circuitry for powering transducers.

While there has been described what is at present considered to be the preferred embodiment of the invention, it will be understood that various modifications may be made therein, and it is intended to cover in the appended claims all such modifications as fall within the true spirit and scope of the invention.

What is claimed is:

1. A generator for energizing an electro-acoustic transducer adapted to be coupled to a load for transferring acoustic energy thereto, said generator comprising a power output circuit coupled to the transducer and including switching means adapted to be connected to an associated source of direct current for producing an alternating current output, pulse generating means coupled to said switching means and providing thereto a series of pulses at an ultrasonic frequency, said switching means being responsive to each of said pulses for establishing a current flow to the transducer for a time period proportional to the duration of said pulse, and current control means coupled to said pulse generating means for varying the widths of said pulses thereby to vary the current flow to the transducer.

2. The generator of claim 1, wherein said pulse generating means includes oscillatory means for generating a triangular waveform, and comparator means coupled to said oscillatory means and operable for initiating a pulse each time the triangular waveform intersects a threshhold level in one direction and for terminating a pulse each time the triangular wave form intersects the threshhold level in the other direction.

3. The generator of claim 2, wherein said control means comprises variable impedance means coupled to said comparator means for varying said threshhold level.

4. The generator of claim 1, wherein said control means includes means for limiting the maximum width of each pulse.

5. The generator of claim 2, wherein said control means includes means for gradually decreasing said threshhold level and thereby increasing the widths of said pulses to a steady-state condition during start-up of said generator.

6. The generator of claim 5, wherein said control means includes means for limiting the maximum width of each pulse.

7. The generator of claim 1, wherein alternate pulses of said series of pulses are of opposite polarity.

8. The generator of claim 1, wherein said power output circuit includes starting means coupled between said switching means and the associated source of direct current for limiting source current at turn-on thereof, and bypass means coupled to said switching means and to said pulse generating means and to the associated source of direct current and responsive to said series of pulses for shorting out said starting means thereby directly to apply the full direct current from the source to said switching means.

9. A generator for energizing an electro-acoustic transducer adapted to be coupled to a load for transferring acoustic energy thereto, said generator comprising a power output circuit coupled to the transducer and including switching means adapted to be connected to an associated source of direct current, said switching means including two transistors each switchable between conducting and nonconducting conditions and operable in the conducting conditions thereof for respectively conducting direct current in opposite directions to the transducer, pulse generating means coupled to each of said transistors and providing thereto a series of pulses at an ultrasonic frequency, each of said transistors being responsive to alternate ones of said pulses for switching to the conducting condition for time periods proportional to the durations of said pulses thereby to provide an alternating current to the transducer, and adjusting means coupled to said pulse generating means for adjusting the maximum widths of said pulses so that each pulse begins a predetermined time interval after the termination of the preceding pulse, said time interval being sufficient to insure cessation of conduction in one transistor before the other transistor is switched to its conducting condition.

10. The generator of claim 9, wherein said switching means comprises a transistor bridge inverter circuit.

11. The generator of claim 9, wherein alternate pulses in said series of pulses are of opposite phase polarity.

12. The generator of claim 9, and further including means for gradually increasing the widths of said pulses to a steady-state condition during start-up of said generator.

13. A generator for energizing an electro-acoustic transducer adapted to be coupled to a load for transferring acoustic energy thereto, said generator comprising a power output circuit coupled to the transducer and including switching means adapted to be connected to an associated source of direct current for providing an alternating output current, pulse generating means coupled to said switching means and providing thereto a series of pulses at an ultrasonic frequency, said switching means being responsive to each of said pulses for establishing an output current flow to the transducer for a time period proportional to the duration of said pulse, and current control means coupled to said pulse generating means and to said power output circuit and responsive to output current flow to the transducer for reducing the widths of said pulses in proportion to the extent that the energy level of said output current exceeds a predetermined level thereby to prevent overloading of said power output circuit.

14. The generator of claim 13, wherein said current control means includes sensing means coupled to said power output circuit for generating a control signal proportional to the extent that the energy level of said output current exceeds said predetermined level, and variable impedance means coupled to said sensing means and to said pulse generating means and responsive to said control signal for reducing the widths of said pulses in proportion to the magnitude of said control signal.

15. The generator of claim 14, wherein said variable impedance means includes a transistor.

16. The generator of claim 13, and further including indicating means coupled to said control means for producing an indicating signal when the energy level of said output current exceeds said predetermined level.

17. A generator for energizing an electro-acoustic transducer adapted to be coupled to a load for transferring acoustic energy thereto, said generator comprising a power output circuit coupled to the transducer and including switching means adapted to be connected to an associated source of direct current, said switching means including two transistors each switchable between conducting and nonconducting conditions and operable in the conducting conditions thereof for respectively conducting direct current in opposite directions to the transducer, pulse generating means coupled to each of said transistors and providing thereto a series of pulses at an ultrasonic frequency, each of said transistors being responsive to alternate ones of said pulses for switching to the conducting condition for time periods proportional to the durations of said pulses thereby to provide an alternating current to the transducer, adjusting means coupled to said pulse generating means for adjusting the widths of said pulses so that each pulse begins a predetermined time interval after the termination of the preceding pulse, said time interval being sufficient to insure cessation of conduction in one transistor before the other transistor is switched to its conducting condition, and current control means coupled to said pulse generating means and to said power output circuit and responsive to the energy level of the output current flow to the transducer for reducing the widths of said pulses in proportion to the extent that the energy level of said output current exceeds a predetermined level thereby to prevent overloading of said power output circuit.

18. A generator for energizing an electro-acoustic transducer adapted to be coupled to a load for transferring acoustic energy thereto, said generator comprising a power output circuit coupled to the transducer and including switching means adapted to be connected to an associated source of direct current for providing an alternating output current, pulse generating means coupled to said switching means and providing thereto a series of pulses at an ultrasonic frequency, said switching means being responsive to each of said pulses for establishing an output current flow to the transducer for a time period proportional to the duration of said pulse, first sensing means coupled to said power output circuit for producing a first control signal proportional to the extent that the energy level of positive excursions of said output current rise above a first predetermined level, second sensing means coupled to said power output circuit for producing a second control signal proportional to the extent that the energy level of negative excursions of said output current fall below a second predetermined level, and variable impedance means coupled to said first and second sensing means and to said pulse generating means and responsive to said control signals for reducing the widths of said pulses in proportion to the magnitude of said control signals thereby to prevent overloading of said power output circuit.

19. The generator of claim 18, wherein said first and second predetermined levels are of different magnitudes.

20. The generator of claim 18, wherein each of said first and second sensing means includes an optically-coupled isolator circuit.

21. In a generator for energizing an electro-acoustic transducer adapted to be coupled through a transmitting horn to a load for transferring acoustic energy thereto, and including a power output circuit coupled to the transducer for providing an alternating current thereto, free-running oscillatory means coupled to said power output circuit and providing thereto an output signal at an ultrasonic frequency for controlling the frequency of the alternating current supplied to the transducer, and a feedback circuit coupled from said power output circuit to said oscillatory means for generating synchronizing signals at the frequency of operation of the transducer to synchronize said oscillatory means thereto: the improvement comprising bandpass amplifier means in said feedback circuit for amplifying only synchronizing signals in a predetermined frequency band, and phase adjusting means for adjusting the center frequency of said frequency band for maximum power transfer to the associated horn in the unloaded condition thereof, said bandpass amplifier means providing maximum amplification of synchronizing signals at said center frequency and attenuating other synchronizing signals in proportion to the difference between the frequency thereof and said center frequency.

22. The combination of claim 21, wherein said phase adjusting means includes a variable reactance.

23. A generator for energizing an electro-acoustic transducer and horn assembly adapted to be coupled to a load for transferring acoustic energy thereto, said generator comprising a power output circuit coupled to the transducer and including switching means adapted to be connected to an associated source of direct current for producing an alternating current output, pulse generating means coupled to said switching means and providing thereto a series of pulses at an ultrasonic frequency, said pulse generating means including free-running oscillatory means for controlling the frequency of said series of pulses, said switching means being responsive to each of said pulses for establishing a current flow to the transducer for a time period proportional to the duration of said pulse, control means coupled to said pulse generating means for varying the width of said pulses thereby to vary the current flow to the transducer, a feedback circuit coupled from said power output circuit to said oscillatory means for generating synchronizing signals at the frequency of operation of the transducer and horn assembly to synchronize said oscillatory means thereto, said feedback circuit including bandpass amplifier means for amplifying only synchronizing signals in a predetermined frequency band, and phase adjusting means for adjusting the center frequency of said frequency band for maximum power transfer to the associated horn in the unloaded condition thereof, said bandpass amplifier means providing maximum amplification of synchronizing signals at said center frequency and attenuating other synchronizing signals in proportion to the difference between the frequency thereof and said center frequency.

24. The generator of claim 23, wherein said oscillatory means includes a phase locked loop circuit.

25. The generator of claim 23, wherein said oscillatory means includes means for generating a triangular waveform, and said pulse generating means further includes comparator means coupled to said oscillatory means and operable for initiating a pulse each time the triangular waveform intersects a predetermined threshhold level in one direction and for terminating a pulse each time the triangular waveform intersects the threshhold level in the other direction.

* * * * *